(12) United States Patent
Ziari et al.

(10) Patent No.: US 6,445,723 B1
(45) Date of Patent: Sep. 3, 2002

(54) LASER SOURCE WITH SUBMICRON APERTURE

(75) Inventors: Mehrdad Ziari, Pleasanton; Scott D. DeMars, Milpitas; Edward C. Vail, Menlo Park; Hanmin Zhao, Milpitas, all of CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/313,444

(22) Filed: May 18, 1999

Related U.S. Application Data

(60) Provisional application No. 60/092,475, filed on Jul. 10, 1998, and provisional application No. 60/086,018, filed on May 18, 1998.

(51) Int. Cl.⁷ ............................................... H01S 5/22
(52) U.S. Cl. .......................................... 372/46; 372/45
(58) Field of Search ..................... 372/45, 46

(56) References Cited

U.S. PATENT DOCUMENTS

| | | | |
|---|---|---|---|
| 4,860,276 A | 8/1989 | Ukita et al. ................. | 369/119 |
| 5,208,821 A | 5/1993 | Berger et al. ................. | 372/48 |
| 5,288,998 A | 2/1994 | Betzig et al. ............... | 250/227 |
| 5,383,215 A | * 1/1995 | Narui et al. .................. | 372/46 |
| 5,625,617 A | 4/1997 | Hopkins et al. ............ | 369/121 |

FOREIGN PATENT DOCUMENTS

| | | |
|---|---|---|
| JP | 1-293687 | 11/1989 |
| JP | 2-119285 | 5/1990 |

OTHER PUBLICATIONS

H.Ukita et al., "Flying Head Read/Write Characteristics Using a Monolithically Integrated Laser Diode/Photodiode at a Wavelength of 1.3 micron" SPIE, vol. 1499, pp 248–261 (No Month).

Y. Katagiri et al., Optical Head Based on Couple–Cavity Laser Diode SPIE, vol. 2514, pp 100–111 (1995) (No Month).

E. Kapon et al., "Single Quantum Wire Semiconductor Lasers" *Applied Physics Letters*, vol. 55(26), pp. 2715–2717 Dec. (1989).

(List continued on next page.)

*Primary Examiner*—James Davie
(74) *Attorney, Agent, or Firm*—Allen, Dyer, Doppelt Milbrath & Gilchrist, P.A.

(57) ABSTRACT

A buried heterostructure (BH) laser source with a narrow active region is disclosed for use in close proximity with optically-addressed data storage media for read/write functionality in a relatively high data density format. The BH laser source is formed on a pregrooved or prepatterned substrate to form mesas upon which epitaxial layers are formed to form laser source active regions that have small emission apertures at the laser source facet output. Selective removal of semiconductor cladding material and replacement of this material with lower refractive index materials provides a way of obtaining further mode size-reduction at the output facet of the laser source. Each mesa has a top surface and adjacent sidewalls such that in the growth of the epitaxial layers above the active region doped with a first conductivity type, the above active region epitaxial layers depositing on the top surface deposit as a first conductivity type and depositing on said sidewalls deposit as a second conductivity type. This growth construction provides for a naturally formed p-n junction at the laser source active region and eliminates the need to perform a subsequent diffusion process to form such a junction. The optical cavities of the laser sources may be tapered so that die cleaving a predetermined point along the length of the optical cavity will provide the desired emission aperture size at the laser source output facet.

27 Claims, 4 Drawing Sheets

OTHER PUBLICATIONS

H. Narui et al., "A Submilliampere–Threshold Multiquantum–Well AlGaAs Laser Without Facet Coating Using Single–Step MOCVD", *IEEE Journal of Quantum Electronics*, vol. 28(1), pp. 4–8 (1992) (No Month).

H Zhao et al. "Submilliampere Threshold Current InGaAs–GaAs–AlGaAs Lasers and Laser Arrays Grown on Nonplanar Substrates", *IEEE Journal of Quantum Electronics*, vol. 1(2), pp. 196–202 (1995) (No Month).

K. Uomi et al. "Ultralow Threshold 2.3 mm InGaAsP/InP Compressive–Strained Multiquantum–Well Monolithic Laser Array for Parallel High–Density Optical Interconnects", *IEEE Journal of Select Topics in Quantum Electronics*, vol 1(2), pp. 203–209 (1995) (No Month).

T.R. Chen et al., "Strained Single Quantum Well InGaAs Lasers with a Threshold Current of 0.25 mA", *Applied Physics Letters*, vol. 63(19), pp. 2621–2623 (Nov. 1993).

* cited by examiner

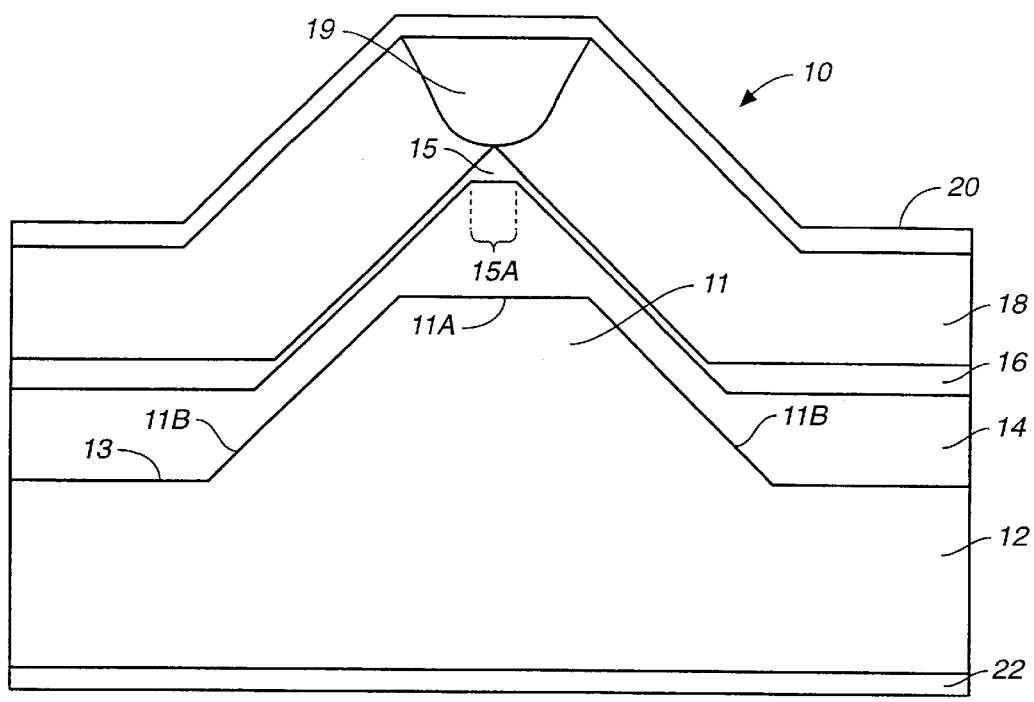
FIG._1 (PRIOR ART)
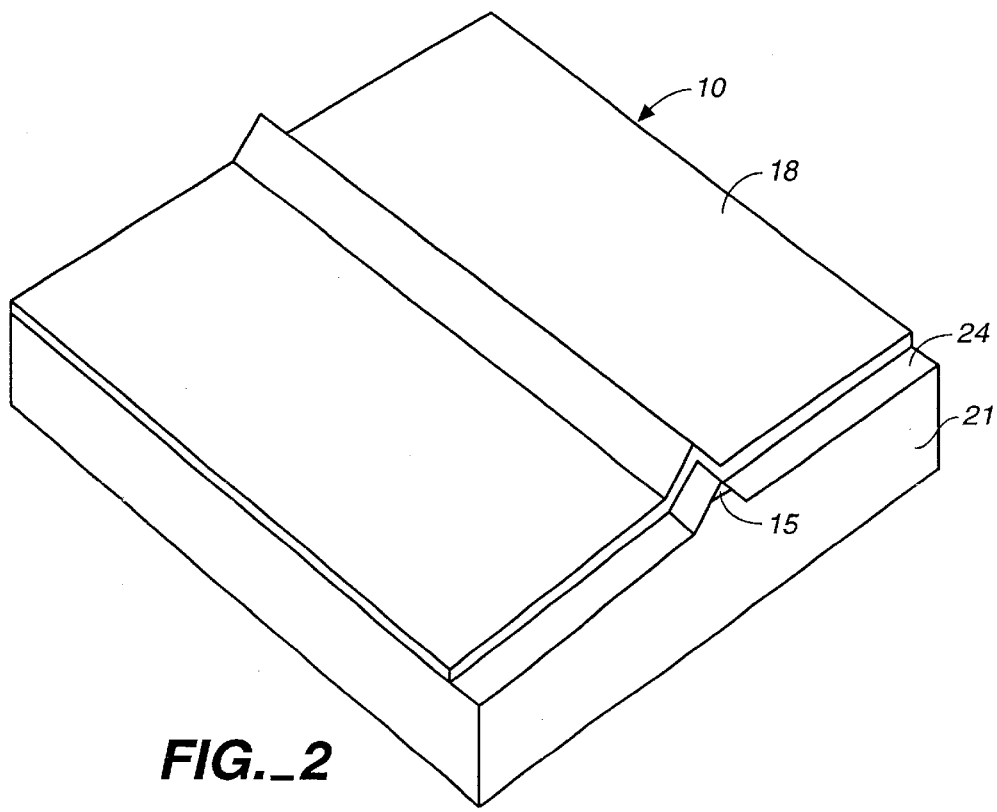
FIG._2

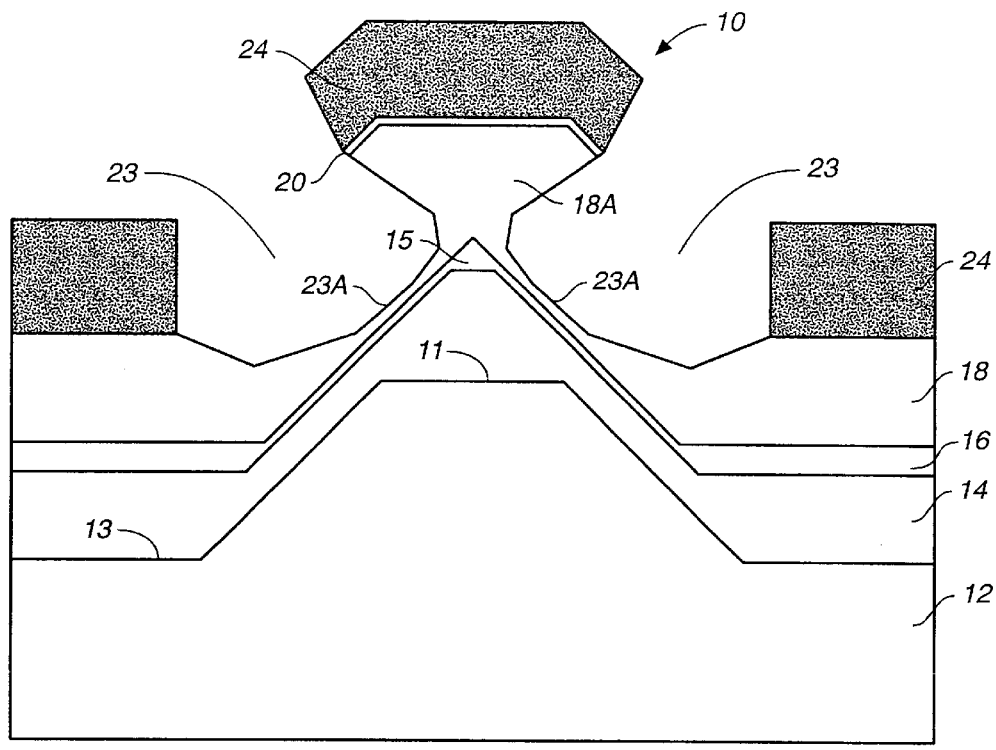
FIG._3
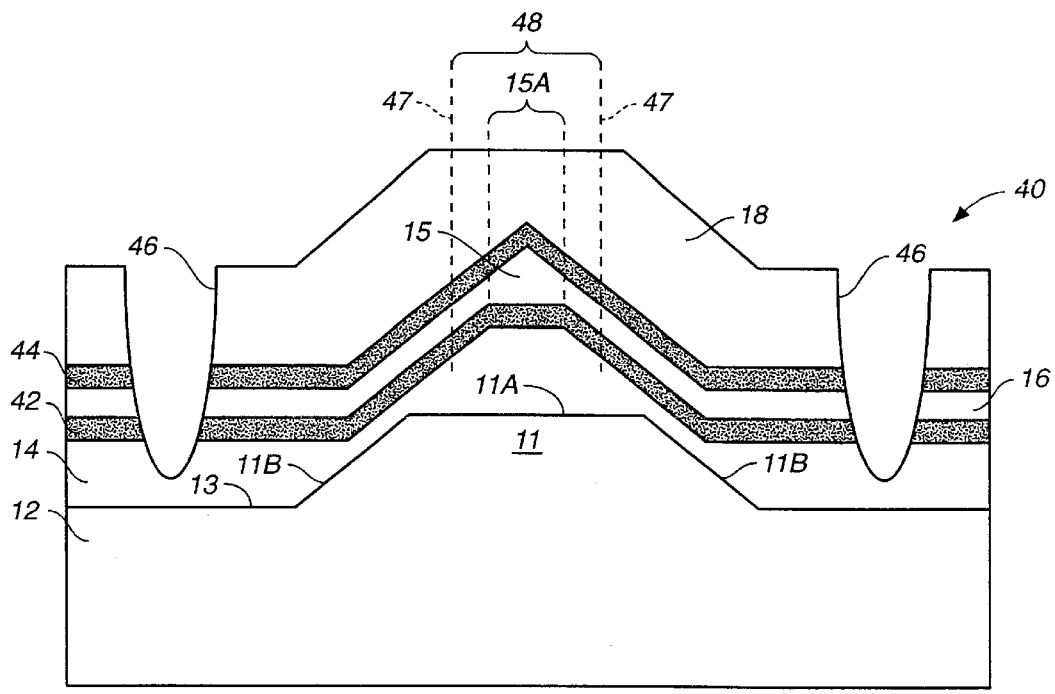
FIG._4

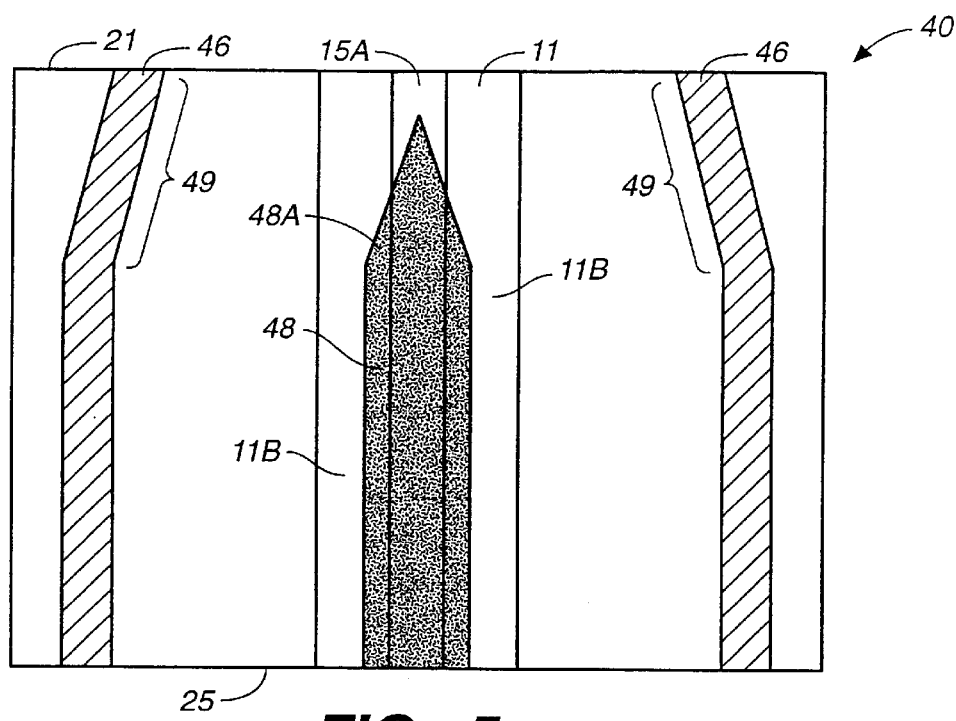
FIG._5
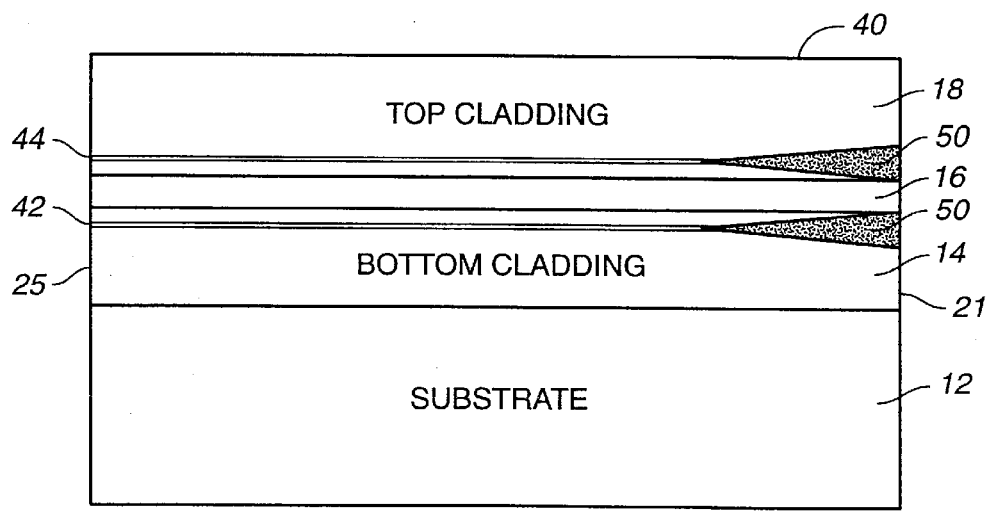
FIG._6

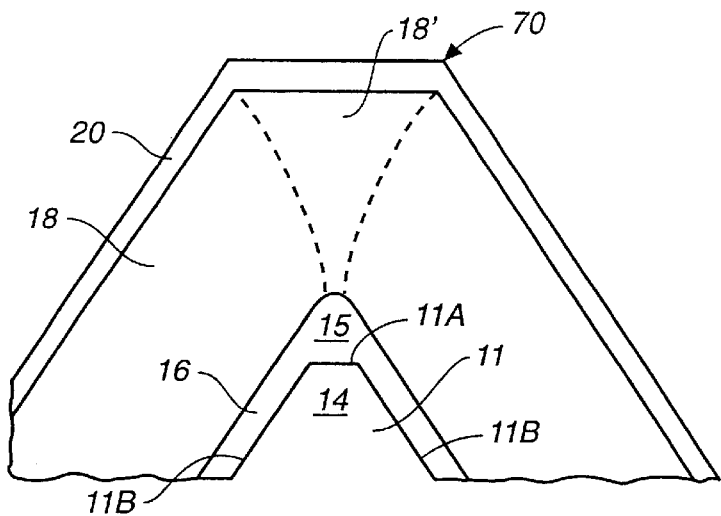
FIG._7
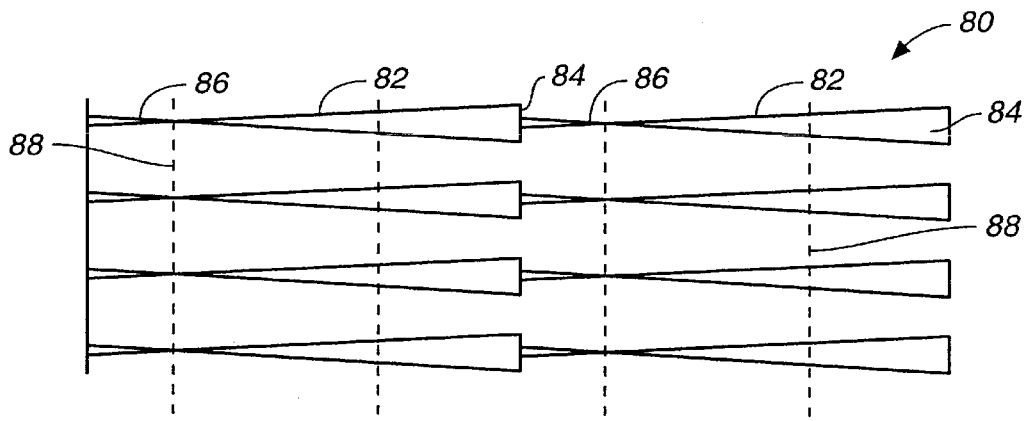
FIG._8
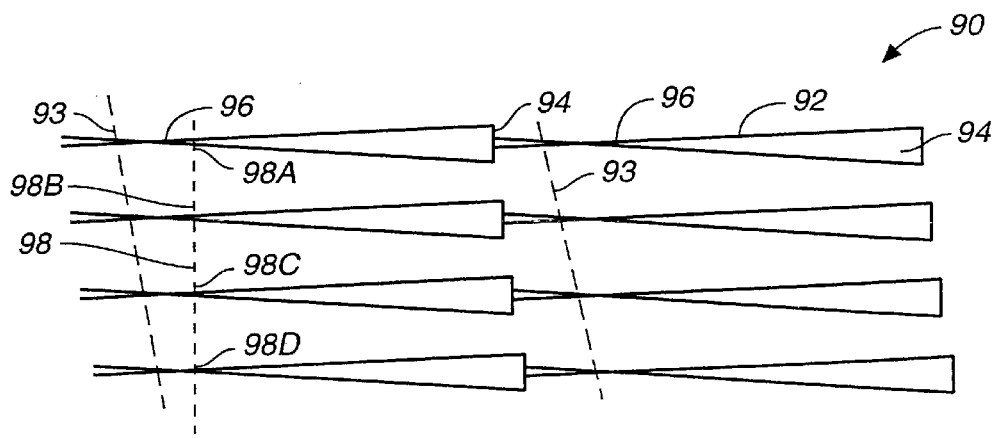
FIG._9

LASER SOURCE WITH SUBMICRON APERTURE

REFERENCE TO RELATED APPLICATION

This application is a continuation-in-part of provisional application, Serial No. 60/092,475, filed Jul. 10, 1998, which is a continuation-in-part of provisional application, Serial No. 60/086,018, filed May 18, 1998, both of which are incorporated herein by their reference.

FIELD OF THE INVENTION

This invention relates generally to laser sources and more particular to laser diodes that have narrow emission apertures of less than one micron in width. Such laser diodes have utility as optical pickup or retrieval of optically stored data on optical recording media.

BACKGROUND OF THE INVENTION

Optical pickup heads in current optical data storage systems impose a limit on the achievable data storage density. A recognized approach to increase the data storage density is to replace the conventional head with a laser diode held in close proximity with the storage medium so that the bit size is commensurate with the extent of the diode'ss near-field emission.

Various approaches are known to produce an optically switched laser (OSL) head for optical data storage systems. Two prominent approaches to achieve a low cost OSL head include the tapered laser adopted by researchers at NTT. See the published article of H. Ukita et al., SPIE, Vol. 1499, pp. 248–261 (1991) and U.S. Pat. No. 4,860,276 to Ukita et al. Also, improved optical mode confinement can be achieved in a laser diode if an aperture or recess for output beam emission is fabricated in the front facet coating as disclosed, for example, in U.S. Pat. No. 5,625,617 to Hopkins et al. Several other approaches exist and typically include the employment of a laser in combination with a solid immersion lens (SIL) or an integrated microlens, such as disclosed in the published article of Y. Katagiri et al., SPIE, Vol. 2514, pp. 100–111 (1995), or an integrated fiber probe using the near field, such as disclosed in U.S. Pat. No. 5,288,998. However, these approaches include additional components to the OSL head structure and increase the complexity of manufacturing as well as the cost of the optical head.

The patent to Berger et al., U.S. Pat. No. 5,208,821, discloses a laser diode formed by MOCVD growth over a patterned substrate comprising dovetailed mesas for forming a "pinch-off" active region of about 2 $\mu$m to 4 $\mu$m wide, as measured relative to the device window 21 formed in SiO$_2$ layer 20. Similar dovetailed structures are shown in Japanese Laid Open Application No. 1-293687, published Nov. 27, 1989 and Japanese Laid Open Application No. 2-119285, published May 7, 1990. These structures, however, are not submicron-aperture laser diodes designed for improving recording or pickup density and threshold operation in optical data storage systems.

The taper laser structure of Ukita et al. In U.S. Pat. No. 4,860,276 is integrated on a substrate with a photodetector at the back facet used to monitor the state of the laser. The taper is introduced via two etched grooves on either side of the laser stripe that converge towards the emission facet and, as such, define the lateral mode confinement at the facet. The primary drawback of this approach is the accurate pattern alignment and high resolution photolithography required to define the mask layer for performing the etching of the trenches. Additionally, the minimum aperture size that has been demonstrated is 1 $\mu$m. However, for providing enhanced density employing near field emission, a 1 $\mu$m aperture is not small enough for efficient near field emission use. The lasers with apodization in the facet coating, demonstrated by Hopkins et al. in U.S. Pat. No. 5,625,617, may be derived from standard single mode lasers. However, to achieve submicron aperture size, the facet of each laser produced requires the formation of a hole in the facet coating created by focused ion beam (FIB) etching, which does not readily lend itself to high yields and standardized reproducibility.

Buried heterostructure lasers have been fabricated in GaAs/AlGaAs based material systems, as disclosed in the articles of E. Kapon et al., "Single Quantum Wire Semiconductor Lasers", *Applied Physics Letters*, Vol. 55(26), pp. 2715–2717 (1989); H. Narui et al., "A Submilliampere-Threshold Multiquantum-Well AlGaAs Laser Without Facet Coating Using Single-Step MOCVD", *IEEE Journal of Quantum Electronics*, Vol. 28(1), pp. 4–8 (1992); and H. Zhao et al., "Submilliampere Threshold Current InGaAs-GaAs-AlGaAs lasers and Laser Arrays Grown on Nonplanar Substrates", *IEEE Journal of Quantum Electronics*, Vol. 1(2), pp. 196–202 (1995). Buried heterostructure lasers have been fabricated in InP based material systems, as disclosed in the articles of K. Uomi et al., "Ultralow Threshold 2.3 $\mu$m InGaAsP/InP Compressive-Strained Multiquantum-Well Monolithic Laser Array for Parallel High-Density Optical Interconnects", *IEEE Journal of Select Topics in Quantum Electronics*, Vol. 1(2), pp. 203–209 (1995) and T. R. Chen et al., "Strained Single Quantum Well InGaAs Lasers with a Threshold Current of 0.25 mA", *Applied Physics Letters*, Vol. 63(19), pp. 2621–2623 (1993).

H. Zhao et al. in *IEEE Journal of Quantum Electronics*, Vol. 1(2), pp. 196–202 (1995) demonstrated that through growth of a buried heterostructure laser on a non-planar substrate, lateral active regions less than 0.5 $\mu$m can be achieved in a GaAs/AlGaAs material system leading to a lateral and vertical near field widths of 0.5 $\mu$m×0.5 $\mu$m. The Zhao et al. structure is illustrated in FIG. 1. To achieve this type of "pinch-off" active region structure, 2 $\mu$m to 3 $\mu$m wide lines on 250 $\mu$m centers were photolithographically patterned onto the semiconductor substrate followed by a chemical etch that terminates on the (111) planes of the material. The narrow, pinch-off active region is formed because of facet dependent growth rates of the epitaxial layers grown onto the nonplanar substrate.

For high speed data links, buried heterostructure lasers have been optimized for low threshold, e.g., less than 1 mA, with high external efficiency, e.g., up to 80%, to around 2 mW output power, but have been demonstrated to, operate in a single mode to output powers as high as 40 mW to 60 mW.

Similar buried heterostructure laser diodes have been demonstrated by others, such as demonstrated by E. Kapon et al. where the structure is formed over a trough as opposed to formation over a mesa in the nonplanar substrate. However, none of these structures have been able to provide a buried heterostructure laser diode having an submicron aperture less than 0.5 $\mu$m, which is an object of this invention.

It is a further object of this invention to provide a laser diode formed on a nonplanar substrate that has a submicron emission aperture with optical emitting mode confinement at the output facet to provide for submicron beam emission, such as below about 0.45 $\mu$m wide emission aperture.

It is another object of this invention to provide a laser diode with a submicron emission aperture for utilizing a near field OSL head to extend the present limit of data density in optical recording and readout media employed in data storage and retrieval apparatus.

SUMMARY OF THE INVENTION

According to this invention, a buried heterostructure (BH) laser diode source with a narrow active region is disclosed for use in close proximity with optically-addressed data storage media for read/write functionality in a relatively high data density format. The BH laser source is formed on a pregrooved or prepatterned substrate to form mesas upon which epitaxial layers are formed to form laser source active regions that have small emission apertures at the laser source facet output. Selective removal of semiconductor cladding material and replacement of this material with lower refractive index materials provides a way of obtaining further mode-size reduction at the output facet of the laser source. Each mesa has a top surface and adjacent sidewalls such that in the growth of the epitaxial layers above the active region doped with a first conductivity type, the above active region epitaxial layers depositing on the top surface deposit as a first conductivity type and depositing on said sidewalls deposit as a second conductivity type. This growth construction provides for a naturally formed p-n junction at the laser source active region and eliminates the need to perform a subsequent diffusion process to form such a junction. The optical cavities of the laser sources may be tapered so that die cleaving at a predetermined point along the length of the optical cavity will provide the desired emission aperture size at the laser source output facet.

To extend the limit of data density in optical data storage, a submicron-aperture laser diode is realized for extending the limit on data density in optical data storage media using the near-field of the submicron-aperture laser diode in a pickup head of an optical disk recording and readout system. Laser diode structures employed by others in the art for OSL heads, as discussed in the Background, utilize fabrication processes requiring submicron photolithography introducing a tightly confining taper structure, or require high precision serial processing on fabricated/yielded laser diodes in order to drill a hole in laser facet coatings. However, the submicron-aperture laser diode of this invention relies substantially on standard photolithography and other applied laser diode processing techniques well adapted in the laser diode manufacturing industry. Adopting such an approach enhances manufacturability, enhances yields, and provides a relative cost advantage in employing the submicron-aperture laser diode of this invention as a pickup head of an optical disk readout system.

The laser diode disclosed here was principally designed for the purpose of use in high speed optical data link for efficient, ultra-low threshold operation with small emission apertures, such as less than 1 $\mu$m and scaleable down to less than 0.5 $\mu$m, to provide high power density output at the facet, without requiring specialized manufacturing processes. The laser diodes of this invention differ from heterostructure laser diodes conventionally used in optical recording and readout in that the lateral aperture width of the laser diode active region is reduced by more than a factor of three to closely match the vertical aperture width of the laser diode active region. An aperture size as small as 0.4 $\mu$m×0.4 $\mu$m can be achieved, which aperture size is constrained by the index step that can be achieved in the semiconductor material system. Further reduction in near-field aperture width down to around 0.4 $\mu$m can be achieved by improved core confinement in the vicinity of the output aperture by, for example, replacing the semiconductor cladding material adjacent to the active region with dielectric material.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a simplified form of the structure of a conventional buried heterostructure laser source having a submicron emission aperture.

FIG. 2 is a perspective view of a first embodiment for forming a submicron emission aperture laser source having a submicron emission aperture.

FIG. 3 is a schematic illustration of an end view of a second embodiment of a buried heterostructure laser source having a submicron emission aperture comprising this invention.

FIG. 4 is a schematic illustration of an end view of the buried heterostructure laser source of FIG. 3 with facet oxidation to provide for adiabatic mode transformation for tight optical confinement.

FIG. 5 is a schematic illustration of a plan view of the buried heterostructure laser source of FIG. 3 with a tapered oxidation for adiabatic mode transformation for tight optical confinement.

FIG. 6 is a schematic illustration of a side elevation of the buried heterostructure laser source of FIG. 3 with tapered oxide spikes extending from the laser source facet for adiabatic mode transformation for tight optical confinement.

FIG. 7 is a partial front view of a SEM photo of a buried heterostructure laser source having a submicron emission aperture with naturally formed conductivity type region above the active region aperture providing a current path to the active region.

FIG. 8 is a tapered stripe pattern employed on the laser source wafer in the practice of the invention.

FIG. 9 is a staggered tapered stripe pattern employed on the laser source wafer in the practice of the invention.

DETAILED DESCRIPTION OF THE PREFERRED EMBODIMENTS OF THE INVENTION

The buried heterostructure to be employed as a starting point for the invention disclosed herein is the separate confinement AlGaAs-GaAs:-InGaAs, structure demonstrated by H. Zhao et al. in *IEEE Journal of Quantum Electronics*, Vol. 1(2), pp. 196–202 (1995), which is incorporated herein in its entirety. The Zhao separate confinement AlGaAs—GaAs—InGaAs structure is shown in a simplified form in FIG. 1 as the more specific details are clearly disclosed in the Zhao incorporated herein. Structure 10 comprises a n-GaAs substrate 12 which is etched to form mesas 11 separated by grooves 13. The pattern of grooves 13 are separated by 2 to 3 $\mu$m wide mesas 11 along the (110) direction using a $H_2SO_4$ etchant such as disclosed in by H. Zhao et al. The formed mesas 11 have a top surface 11A in the (100) direction with sidewalls 11B formed in (111) direction. Epitaxial growth is then performed on nonplanar substrate 12 using the temperature engineered growth as explained in the Zhao article comprising n-$Al_xGa_{1-x}As$ cladding layer 14, active region 16 comprising GaAs—InGaAs—GaAs, followed by a pair of cladding layers 18, in particular, consecutive layers of p-$Al_xGa_{1-x}As$ and n-$Al_xGa_{1-x}As$. This is followed by a cap layer of n-GaAs, not shown in FIG. 1. The growth of these active layers produces an active region 15 which is confined to a small area of the top of the mesa growth to form a waveguide region buried within the cladding regions that has an emission region of submicron in dimension. Active region 15 has lateral width 15A on the mesa 11 of about 0.4 µm.

The growth of these epitaxial layers is followed by selective zinc diffusion from the top of the structure to produce a p-type region 19 coupled to form active region 15. This diffusion provides for a current path through the previously deposited n-type cladding and cap layers to from a p-n junction across the active region 15. The top metal contact layer 20 and substrate bottom metal contact layer 22 complete the contacting of the buried heterostructure laser source.

The smallest mode size that can be obtained with a buried heterostructure laser source is a function of the largest refractive index step that can be provided between the waveguide core or active region and the adjacent cladding material. The maximum refractive index difference for a buried heterostructure laser is approximately $\Delta n=0.3$, which leads to a minimum near field width of 0.4 µm defined as the full width at the $1/e^2$ points in the intensity distribution. These specifications are sufficient for initial submicron aperture laser demonstration and lend well to further aperture size reduction through replacement of the semiconductor cladding material near the output facet with a lower refractive index dielectric material.

The formation of the active region on the top of the mesa as opposed to within the trough, as demonstrated by Kapon et al., is advantageous since it provides access for additional processing in which the cladding layers may be etched away near the output facet 21, as shown in FIG. 2 at 24 and replaced by a dielectric layer, such as $SiO_2$, to reduce the near-field mode size. The results would be a region extending over the mesa near the output facet 21, as shown in FIG. 2, in which the optical mode is bounded on three sides by a large refractive index difference (i.e. air). Removal of the cladding layers 18 by etching can be performed during the planar processing and would not require high resolution photolithography. These cladding-etched narrow buried heterostructure (CENBH) laser sources 10 would have an effective lateral aperture of less than 0.25 µm.

The concerns that arise when cladding layers 18 are modified near output facet 21 are the magnitude of the mode transition losses that may be incurred, the new mode dimensions, and the containment of the scattered light. Because the optical mode entering the region near facet 21 is already tightly confined, the mode transition losses will be small compared to such a transition if it were made in a conventional laser employing the usual 3 µm to 4 µm wide laser stripe. Thus, this is a major technical advantage of this approach. The low transition losses will lead to low scattered light level at facet 21. The transition may be placed at a distance from the facet that assures a broad spread of the light that is scattered and low probability of coupling of scattered light back into the laser structure. The greatest technical challenge is to design the etch process and etched region such that the optical mode entering that region is not significantly pushed downward toward the substrate before reaching the facet 21. Otherwise, a reduction in near field size may not be realized. In order to address this issue, the approach shown in FIG. 3 is adopted wherein cladding layers 18 are removed only longitudinally along the sides of the as-grown mesa laser structure so that the vertical waveguide remains symmetrically bounded by semiconductor cladding material. This shown in FIG. 3 by the provision of forming a selective masking using photoresist layer 24 where exposed regions 25 are photolithographically formed in layer 24. Then an etchant is applied and is time controlled to achieve a desired depth without destroying the integrity of active region 15 forming etched regions 23.

The laser structure of FIG. 3 can potentially have a 0.25 µm×0.4 µm or less emitting mode size because of the large lateral refractive index step created when the semiconductor material is etched away in regions 23. Photoresist layer 24 shown in FIG. 3 is removed after the etching is performed to provide a bare surface upon which a metal contact layer 20 is provided, which, for the purposes of simplicity, is already shown in FIG. 3. To improve the structural and mechanical integrity of the cladding semiconductor cladding material 18A that remains over stripe region 26, a portion of the surface of laser source 20, including the filling in of etched regions 23, may be coated with a polymer or other dielectric material. The refractive index step from the waveguide core to the dielectric material would still be sufficiently large to provide tight mode confinement and additionally, any part of the active region that may be exposed would be protected by the dielectric material. The front and back facets of the laser can be appropriately coated to provide adequate front facet power and reasonable bias current levels to perform the read/write functions.

The laser structure shown in FIG. 3 may be employed in combination with optical recording media to provide very high density storage. The NBH or CENBH laser source 10 would be bonded to a slider mechanism of an optical head in an optical disk system. As to the type of optical head, see U.S. Pat. Nos. 4,860,276 and FIGS. 4A–4D and 5,625,617 and FIGS. 10 and 11, both of which are incorporated herein by their reference relative to an applicable slider mechanism. The slider would support the laser source 10 in close proximity to the surface of the optical media. The distance from the optical media would be approximately equal to or less than either dimension of the output optical mode of laser source 10. This distance is made small so that the media surface is, in part, within the near field range of the optical emission from laser source 10. The laser source 10 would then function as an optically switched laser (OSL) so that bits on the optical media surface could be read or written based on the level of current bias applied to laser source 10.

Further improvements in reliability can be achieved in conjunction with slider use by applying a hard coating to the laser output facet 21 to protect its integrity from contact with the optical media surface. Also, the integration of multiple laser sources 10 on a single chip would provide for additional functional operation such as optical media tracking.

Although the bit optical media bit size is approximately equal to the near field size of the optical mode of laser source 10, and, therefore, is not dependent to the first order of the emitting wavelength of the laser. However, the sensitivity or response of various optical media may be dependent upon the wavelength.

The laser source 10 may be fabricated with several Group III–V material systems to achieve optimized response from the optical media. An InGaAs quantum well laser source, according to the design in the use of a AlGaAs—GaAs—InGaAs, the designed wavelength is selected from the wavelength range of about 850 nm to about 1,000 nm. It may be feasible to make a AlGaAs quantum well laser that could operate in the range of about 760 nm to 850 nm. The InGaAlP material system may also be employed since the use of the etch-stop process for forming regions 23 is available and, therefore, laser sources 10 with outputs within the visible range from about 630 nm to 670 nm would be realized. Also, the GaN/InGaN material regime may be utilized to obtain even higher recording densities with shorter wavelengths within the range of blue or near ultraviolet light, such as, for example, blue light around 460 nm.

As shown in FIG. 2, a method for further reducing laser aperture size by uniformly etching away the laser active region cladding layers 18 near or adjacent to laser output facet 21 is shown. A possible disadvantage in this approach is that it is difficult to constrict the mode a significant amount before the propagating mode becomes "pushed" down into substrate 12. A problem with the etching approach shown in FIG. 3 is that very accurate alignment and etching of cladding layers 18 is required and with the structure being somewhat delicate with exposed upstanding region 18A, it is difficult to accomplish a reproducible accurate etch depth each time to a point 23A in close proximity to active region 15 as shown. Some of these problems may be alleviated by developing a self aligned process and filling in gaps with polyimide or $SiN_x$. However, a simpler method illustrated in FIG. 4 may be applied that would result in tighter mode confinement, higher yield, and less complicated processing.

FIG. 4 shows laser source 40, modified from laser source 10 in that it includes two spatially disposed oxidizing layers 42 and 44 deposited during the MOCVD growth of source 40. The method is to employ a subsequent oxidation of oxidizing layers 42 and 44 to more tightly confine the laser mode since the oxidation of layers 42, 44 will expand from their initially deposited positions narrowing the aperture region 15A and tightening the confinement of the optical field. An example of the a material for oxidizing layers 43, 44 is AlAs. During the MOCVD growth of laser source 40, high aluminum concentration layers 42, 44, e.g., having an Al content greater than 95%, would be sequentially grown on either side of the active layer 16. After growth of the laser structure, deep trenches 46 would be etched on adjacent sides of active region 15 near output facet 21. The particular placement of trenches 46 is not critical. Laser source 40 is then placed in a steam ambient in an oxidation furnace at approximately 450° C. The high Al content layers 42, 44 will then laterally oxidize inwardly to a point marked by vertical dotted lines 47, forming a stable low refractive index oxide (n~1.5) and leaving an unoxidized region 48, a plan view of which is shown, in part, in FIG. 5. The high refractive index difference can confine the mode very tightly in both the vertical and horizontal directions, allowing aperture output spot sizes as small as 0.4 μm.

The advantages of this technique is that the structure is very robust and no critical alignments are required. The high Al content layers 42, 44 would be completely oxidized so that the amount of lateral oxidation is not important. In order to reduce the losses while transitioning from the standard laser region 15 to a more tightly confined area, the spacing of trenches 46 are slowly tapered at 49 toward one another near output facet 21 as shown in FIG. 5. This forms a tapered unoxidized region 48A approximate to the output facet 21. This will allow the mode to adiabatically contract down to a smaller size such as 0.4 μm at output facet 21. In addition, the oxide layers could also function as electrical blocking layers if the deposition of layers 42, 44 are terminated in the regions indicated at 47, i.e., on either side of the upward slope of mesa 11. This would obviate the need for a silicon nitride ($SiN_x$) layer on top of the laser structure with a formed opening for current passage and pumping of the laser source 40. Instead, a p-contact could be placed uniformly across the top of the laser source.

One difficulty with the approach of FIG. 5 may be cleaving the as-grown wafer into laser diode sources. Cleave points sometimes have difficulty in forming straight line cleaves in traveling across formed amorphous oxide layers such as layers 42, 44. An alternate approach, therefore, would be that shown in FIG. 5 wherein, first, rear facet 25 is coated to protect it from the oxidizing atmosphere. No etched trenches 46 would be necessary. Next, laser source 40 is then placed in a steam ambient in an oxidation furnace at approximately 450° C. The high Al content layers 42, 44 will then laterally oxidize, forming a stable low refractive index oxide (n~1.5). The taper 48A shown in FIG. 5 is not scale and would be relatively small, such as about 4 μm occurring over a transition region length of somewhere around 250 μm.

One possible problem with the technique demonstrated in FIG. 5 is the abrupt junction between oxidized regions and the unoxidized regions of layers 42, 44 which may introduce unacceptable optical losses to the mode. However, there is a way around this problem which is illustrated in FIG. 6. Thin high Al concentration layers 42, 44, such a high Al content AlGaAs layers, are surrounded by lower Al concentration layers of cladding layers 14 and 18. The oxidation rate in the oxidation furnace is highly dependent on the Al concentration in the as-grown layers. So the high Al concentration layers 42, 44 will quickly oxidize inward forming "spikes" 50 into the laser structure. In other words, high Al content layers 42, 44 would oxidize inwardly of the output facet 21 as shown in FIG. 6 at 50, at a much faster rate than layers 14 and 18. The spikes 50 could have a tapered shape with a slow lateral oxidation in the lower Al concentration layers. Oxidation has been shown to deeply penetrate the AlGaAs structure, up to hundreds of microns thereby allowing the formation of gradual adiabatic tapers 50 that tightly confine the mode as its exits the laser structure at front facet 21.

A more improved NBH laser source with the tightly confined optical mode down to 0.1 μm would be one that could be fabricated without the need of an upper cladding layer 18 of n-type $Al_xGa_{1-x}As$ through which a subsequent selective diffusion process must be applied with alignment accuracy relative to the top of mesa 11. We have discovered that if p-doped $Al_xGa_{1-x}As$ is deposited on the active layer 16 rather than n-doped $Al_xGa_{1-x}As$, the buried p-doped $Al_xGa_{1-x}As$ layer will be deposited only p-type $Al_xGa_{1-x}As$ on the (100) surface, i.e., the top surface 11A of mesa 11, and will be deposited as n-type $Al_xGa_{1-x}As$ on the (111) side surfaces 11B of mesa 11 due to significantly lower incorporation of the p-type species on the side surfaces 11B in the MOCVD process as best seen in FIG. 1. In the deposit of Ga or As constituents on these sidewalls 11B, only one such constituent can be deposited on the (111) surface 11B at any given time or at least until one monolayer of a respective constituent is almost completely formed on the sidewall surfaces. As a result, the substitutional or interstitial p-type dopant does not have an opportunity to become part of the grown molecular lattice structure. As shown the SEM photo in FIG. 7, the as-grown cladding layer 18 of p-doped $Al_xGa_{1-x}As$ is grown on sidewalls 11B as n-$Al_xGa_{1-x}As$ whereas its growth above mesa surface 11A is p-$Al_xGa_{1-x}As$. The p-type growth of layer 18 is clearly visible in FIG. 7 at 18' extending from active region 15 all the way up to the top surface of the structure. This natural selectively relative to the (100) and (111) surface eliminates the requirement of employing a selective diffusion process after the laser source structure growth is completed. The formation of the p-side of the active region junction occurs automatically as cladding layers are deposited p-type.

It is difficult when forming laser die from as-grown wafers to achieve uniform emission aperture widths. A manner of solving this problem is to provide tapered active regions 15 by forming longitudinal tapered mesa structures on substrate 12. If a gradual change in stripe width from one end of a 1,500 µm long cavity, for example, is introduced, then, at some point along the cavity length, the mesa top surface width will be an appropriate width to achieve the desired active region shape and output aperture width. The cleaving positions can be observed at the earliest stage in the fabrication process and at the end of fabrication so the that the wafer can be cleaved into laser die at appropriate positions. The cavity lengths can then be measured from the appropriate cleaved positions. In the example here, if a taper is from a submicron width to a 5 µm width for a 1,500 mm mesa taper length, then a 10 µm uncertainty as to the appropriate cleave position leads to only a 0.03 µm uncertainty in mesa top width error, which is only about 10%, Thus, a 750 µm cavity would then have an active region width tapering from 0.35 µm to 2.85 µm, which is consistent with single mode operation. In FIG. 8, a pattern layout 80 is shown for the tapered mesas 82 in aligned rows, in side-by-side relation, as formed via a mask and selective etching on a GaAs wafer. The tapered mesas 82 having a large end 84 tapering down to a point at 86. Dotted lines 88 represent the cleave positions. As an example of the tapers is a mesa length of 1,500 µm and having a width of 15 µm at end 84 and a submicron width at cleave point 88. In FIG. 9, a staggered pattern layout 90 is shown for the tapered mesas 92 in aligned rows, in staggered relation as seen by dashed lines 93, as formed via a mask and selective etching on a GaAs wafer. The tapered mesas 92 having a large end 94 tapering down to a point at 96. Dotted lines 98 represent the cleave positions which are normal to the longitudinal axes of mesas 92 so that the cleaves will fall along different tapered widths 98A, 98B, 98C and 98D along the tapered mesas 92. For example, the taper length of mesas 92 may be 1,500 µm and each tapered mesa 92 is staggered relative to adjacent tapered mesas 92 by approximately 20 lm so that, in a single cleave through the tapered pattern at cleave point 98, the mesa width at the cleave point 98 will change by approximately 0.2 µm from one adjacent mesa 92 to the next.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications that are within the spirit and scope of the following claims.

What is claimed is:

1. A buried heterostructure (NBH) laser source comprising:
   a nonplanar substrate having a mesa'son said substrate;
   a plurality of epitaxial layers formed on said nonplanar substrate such that an active region is formed on a top surface of said mesa that has a submicron width surrounded by epitaxial layers of lower refractive index than said active region, said active region providing a waveguide cavity for propagation of a single fundamental mode;
   the improvement comprising means in said source for providing a tighter confinement of the propagating mode providing a narrow emission aperture at an output facet of the source having an emission aperture width around 0.4 µm.

2. The buried heterostructure (NBH) laser source of claim 1 wherein said tighter confinement means comprises the removal of deposited epitaxial deposited layers formed above said active region at said output facet.

3. The buried heterostructure (NBH) laser source of claim 2 wherein said layer removal is along a length of said waveguide cavity on adjacent sides of said active region.

4. The buried heterostructure (NBH) laser source of claim 2 wherein areas of said layer removal are coated and filled with a material having a refractive index lower than said active region.

5. The buried heterostructure (NBH) laser source of claim 4 wherein said material is a dielectric material.

6. The buried heterostructure (NBH) laser source of claim 5 wherein said dielectric material is a polymer.

7. The buried heterostructure (NBH) laser source of claim 1 wherein said mesa has a top surface and adjacent sidewalls such that in the growth of said epitaxial layers above said active region doped with a first conductivity type, said above active region epitaxial layers depositing on said top surface as said first conductivity type and depositing on said sidewalls as a second conductivity type.

8. The buried heterostructure (NBH) laser source of claim 7 wherein said first conductivity type is p-type and said second conductivity type is n-type.

9. The buried heterostructure (NBH) laser source of claim 8 wherein said above active region epitaxial layers are AlGaAs or GaAs.

10. The buried heterostructure (NBH) laser source of claim 1 wherein said waveguide cavity is at least partially tapered to said output facet.

11. The buried heterostructure (NBH) laser source of claim 10 wherein said source is cleaved across said tapered cavity at point of desired lateral emission aperture width.

12. The buried heterostructure (NBH) laser source of claim 1 wherein said source is a die from a plurality of said sources formed on a semiconductor wafer, the waveguide cavities of adjacently position sources positioned on said wafer staggered relative to one another so that upon cleaving in a line transversely of their longitudinal extent, waveguide cavities of different lengths are formed.

13. The buried heterostructure (NBH) laser source of claim 12 wherein said waveguide cavities are tapered.

14. A buried heterostructure (NBH) laser diode that has a narrow emission aperture for use in an optical pickup head with high aluminum content layers formed adjacent to and on opposite sides of the active region and thereafter etching vertical trenches on either side of the active region forming the narrow emission aperture, oxidizing the exposed side edges of the high aluminum content layers to form a high index difference between these layers and the active region so as to confine the mode very tightly in orthogonal directions, creating an emission aperture spot size less than 1 µm in either orthogonal direction.

15. The buried heterostructure (NBH) laser diode source of claim 14 wherein said emission aperture spot size is on the order of 0.4 µm.

16. The buried heterostructure (NBH) laser diode source of claim 14 wherein said high aluminum content layers have an aluminum content greater than 95%.

17. A buried heterostructure (NBH) laser diode source comprising a narrow emission aperture for use in an optical pickup head, an oxidizing source formed in the laser diode source adjacent to its active region to form a stable low refractive index oxide upon oxidation, the oxidation providing for additional limited optical confinement of the narrow emission aperture.

18. The buried heterostructure (NBH) laser diode source of claim 17 wherein the emission aperture confinement is about 0.4 nm.

19. The buried heterostructure (NBH) laser diode of claims 17 wherein said oxidizing source comprises at least one layer of a Group III–V compound capable of being oxidized after epitaxial growth.

20. The buried heterostructure (NBH) laser diode of claim 19 wherein said layer is of high AL concentration.

21. The buried heterostructure (NBH) laser diode of claim 20 wherein said layer is AlAs or AlGaAs.

22. The buried heterostructure (NBH) laser diode of claim 20 wherein said layer has an aluminum content greater than 95%.

23. A buried heterostructure (NBH) laser source comprising:

a nonplanar substrate having a mesa on said substrate;

a plurality of epitaxial layers formed on said nonplanar substrate such that an active region is formed on a top surface of said mesa surrounded by epitaxial layers of lower refractive index than said active region, said active region providing a waveguide cavity for propagation of a single fundamental mode;

said mesa having a top surface and adjacent sidewalls such that in the growth of said epitaxial layers above said active region doped with a first conductivity type, said above active region epitaxial layers depositing on said top surface as said first conductivity type and depositing on said sidewalls as a second conductivity type.

24. The buried heterostructure (NBH) laser source of claim 23 wherein said first conductivity type is p-type and said second conductivity type is n-type.

25. The buried heterostructure (NBH) laser source of claim 24 wherein said above active region epitaxial layers are AlGaAs or GaAs.

26. The buried heterostructure (NBH) laser source of claim 23 wherein said waveguide cavity is at least partially tapered to said output facet.

27. The buried heterostructure (NBH) laser source of claim 23 wherein said fist and second conductivity type formation on said mesa form a p-n junction relative to the laser source active region.

* * * * *

UNITED STATES PATENT AND TRADEMARK OFFICE
CERTIFICATE OF CORRECTION

PATENT NO. : 6,445,723 B1
DATED : September 3, 2002
INVENTOR(S) : Ziari et al.

It is certified that error appears in the above-identified patent and that said Letters Patent is hereby corrected as shown below:

<u>Column 9,</u>
Line 55, "mesa'son" should read -- mesa on --

Signed and Sealed this

Twenty-sixth Day of November, 2002

Attest:

Attesting Officer

JAMES E. ROGAN
*Director of the United States Patent and Trademark Office*